(12) United States Patent
Kusunoki et al.

(10) Patent No.: US 10,707,046 B2
(45) Date of Patent: Jul. 7, 2020

(54) ELECTRON SOURCE AND ELECTRON BEAM DEVICE USING THE SAME

(71) Applicant: Hitachi High-Tech Corporation, Minato-ku, Tokyo (JP)

(72) Inventors: Toshiaki Kusunoki, Tokyo (JP); Keigo Kasuya, Tokyo (JP); Takashi Ohshima, Tokyo (JP); Tomihiro Hashizume, Tokyo (JP); Noriaki Arai, Tokyo (JP); Yoichi Ose, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/480,405

(22) PCT Filed: Dec. 8, 2017

(86) PCT No.: PCT/JP2017/044177
§ 371 (c)(1),
(2) Date: Jul. 24, 2019

(87) PCT Pub. No.: WO2018/159056
PCT Pub. Date: Sep. 7, 2018

(65) Prior Publication Data
US 2019/0385809 A1    Dec. 19, 2019

(30) Foreign Application Priority Data

Feb. 28, 2017   (JP) ................. 2017-035882

(51) Int. Cl.
*H01J 37/073*    (2006.01)
*H01J 37/20*    (2006.01)

(52) U.S. Cl.
CPC ............ *H01J 37/073* (2013.01); *H01J 37/20* (2013.01); *H01J 2237/061* (2013.01)

(58) Field of Classification Search
USPC .............................................. 250/423 F, 426
See application file for complete search history.

(56) References Cited

U.S. PATENT DOCUMENTS

| 4,309,638 A | 1/1982 | Van Roosmalen et al. |
| 2015/0002009 A1 | 1/2015 | Zhang et al. |

(Continued)

FOREIGN PATENT DOCUMENTS

| JP | 56-30930 B2 | 7/1981 |
| JP | 63-276848 A | 11/1988 |

(Continued)

OTHER PUBLICATIONS

International Search Report (PCT/ISA/210) issued in PCT Application No. PCT/JP2017/044177 dated Feb. 27, 2018 with English translation (seven (7) pages).

(Continued)

*Primary Examiner* — Kiet T Nguyen
(74) *Attorney, Agent, or Firm* — Crowell & Moring LLP

(57) ABSTRACT

An electron source that can be used stably for a long time even when hexaboride is used, and an electron beam device using the electron source are provided. The invention is directed to an electron source which includes a filament made of a metal, a metal tube that is fixed to the filament and has a plurality of recesses disposed at least in two axial directions so as to surround a central axis at an outer periphery, and a columnar hexaboride tip that emits an electron, is disposed so as to protrude from the inside of the metal tube to a side opposite to the filament, and is in contact with a bottom of each of the plurality of recesses of the metal tube.

13 Claims, 21 Drawing Sheets

(56) References Cited

U.S. PATENT DOCUMENTS

2015/0287565 A1* 10/2015 Tomita .................. H01J 35/16
  378/137
2019/0066966 A1    2/2019 Kusunoki et al.

FOREIGN PATENT DOCUMENTS

| JP | 64-7450 A | 1/1989 |
| JP | 5-94759 A | 4/1993 |
| JP | 2014-229492 A | 12/2014 |
| JP | 2017-157368 A | 9/2017 |
| WO | WO 2014/007121 A1 | 1/2014 |

OTHER PUBLICATIONS

Japanese-language Written Opinion (PCT/ISA/237) issued in PCT Application No. PCT/JP2017/044177 dated Feb. 27, 2018 (three (3) pages).

* cited by examiner

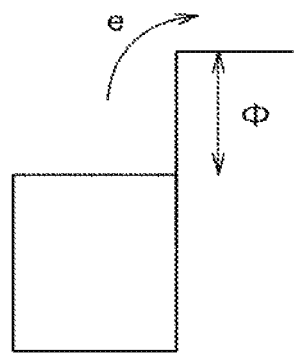
[FIG. 1A]
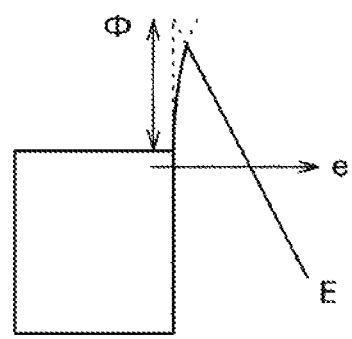
[FIG. 1B]
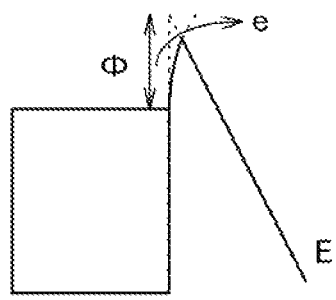
[FIG. 1C]

[FIG. 2]
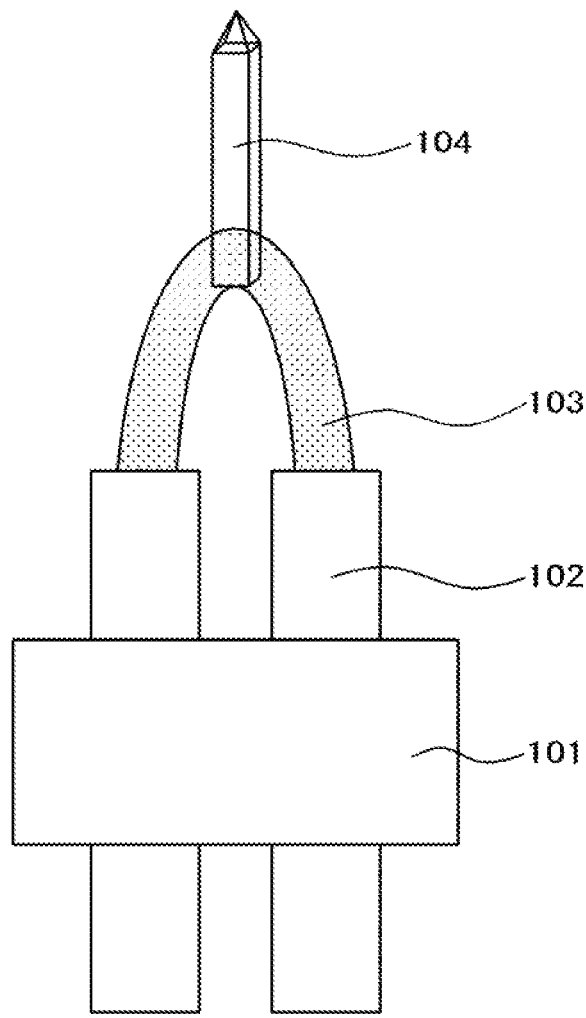
[FIG. 3]
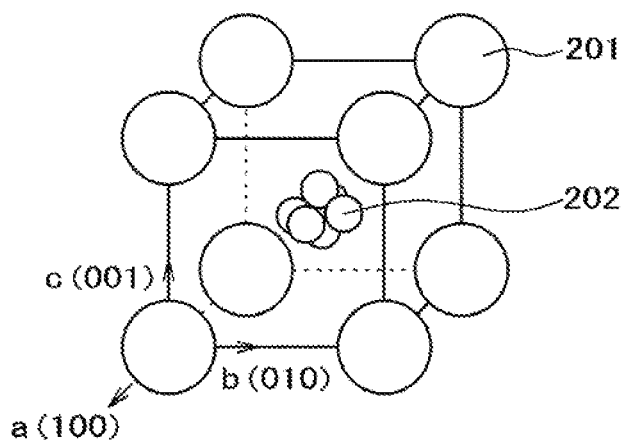

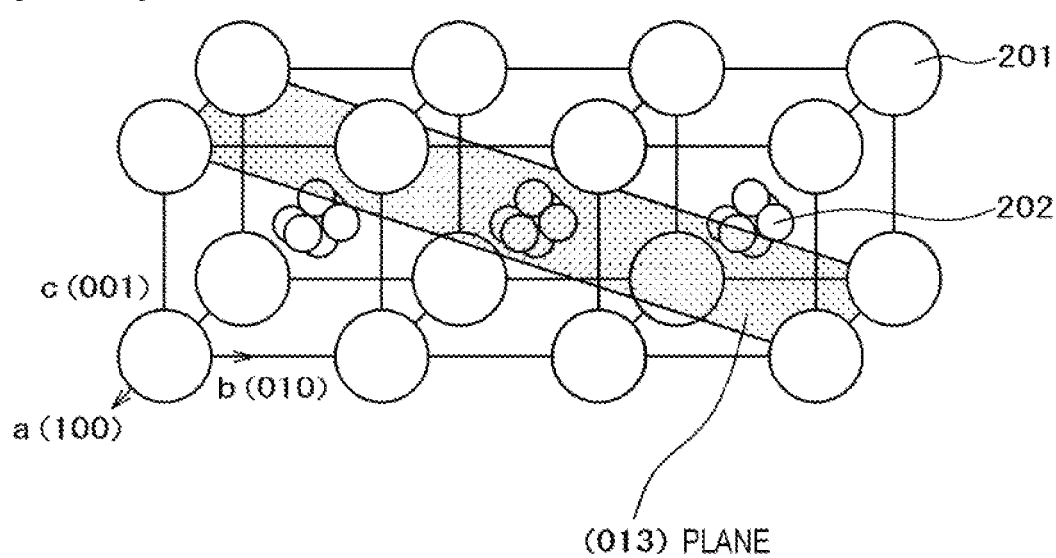
[FIG. 4]

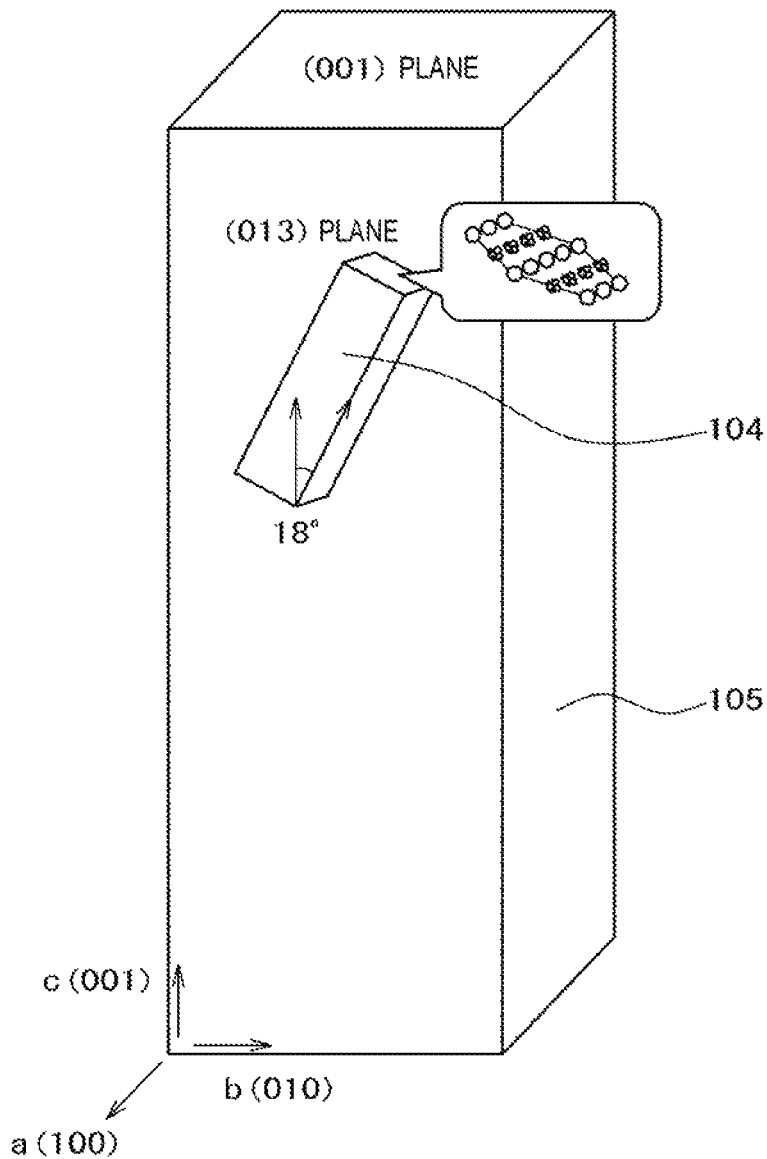
[FIG. 5]

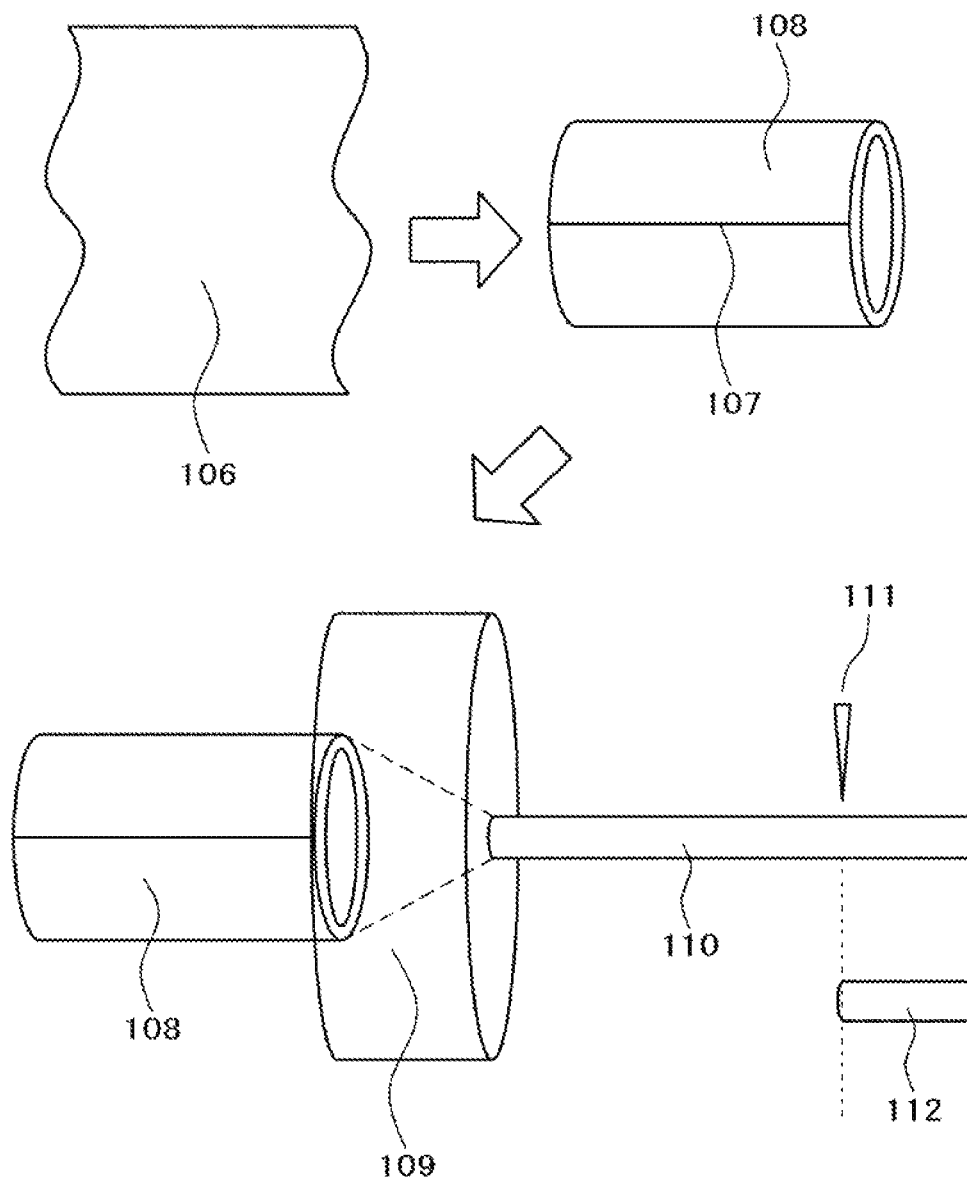
[FIG. 6]

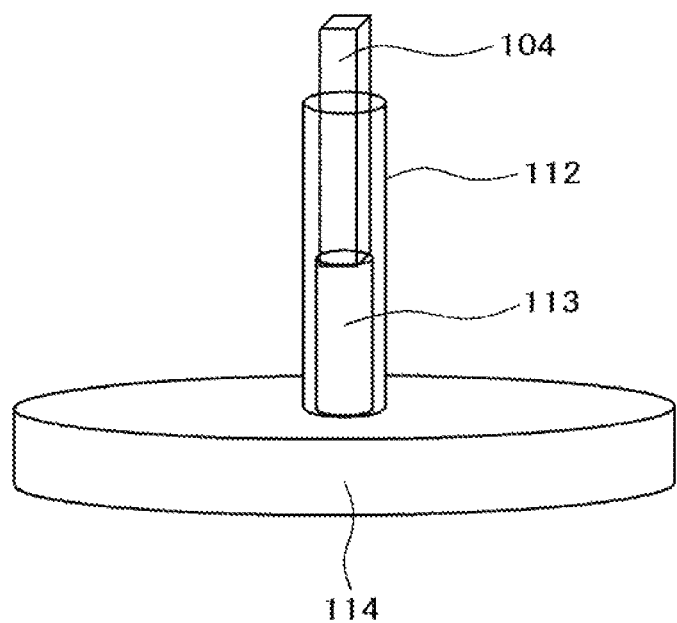
[FIG. 7]

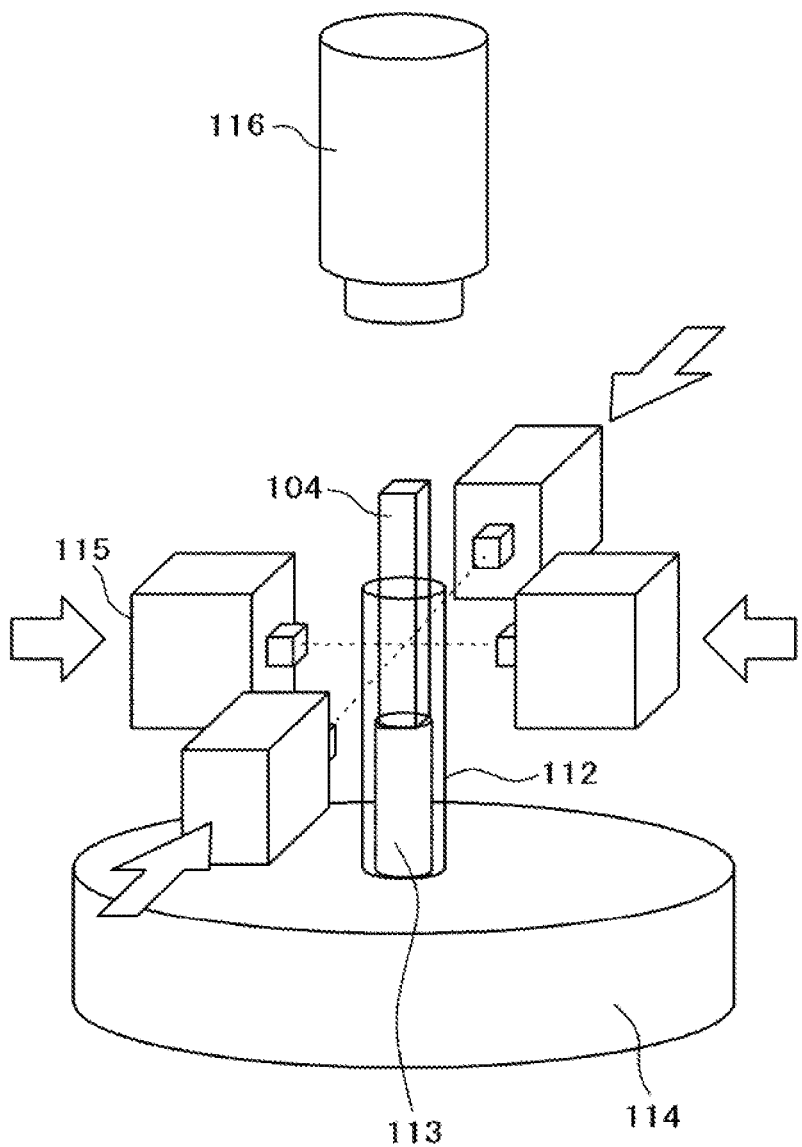
[FIG. 8]

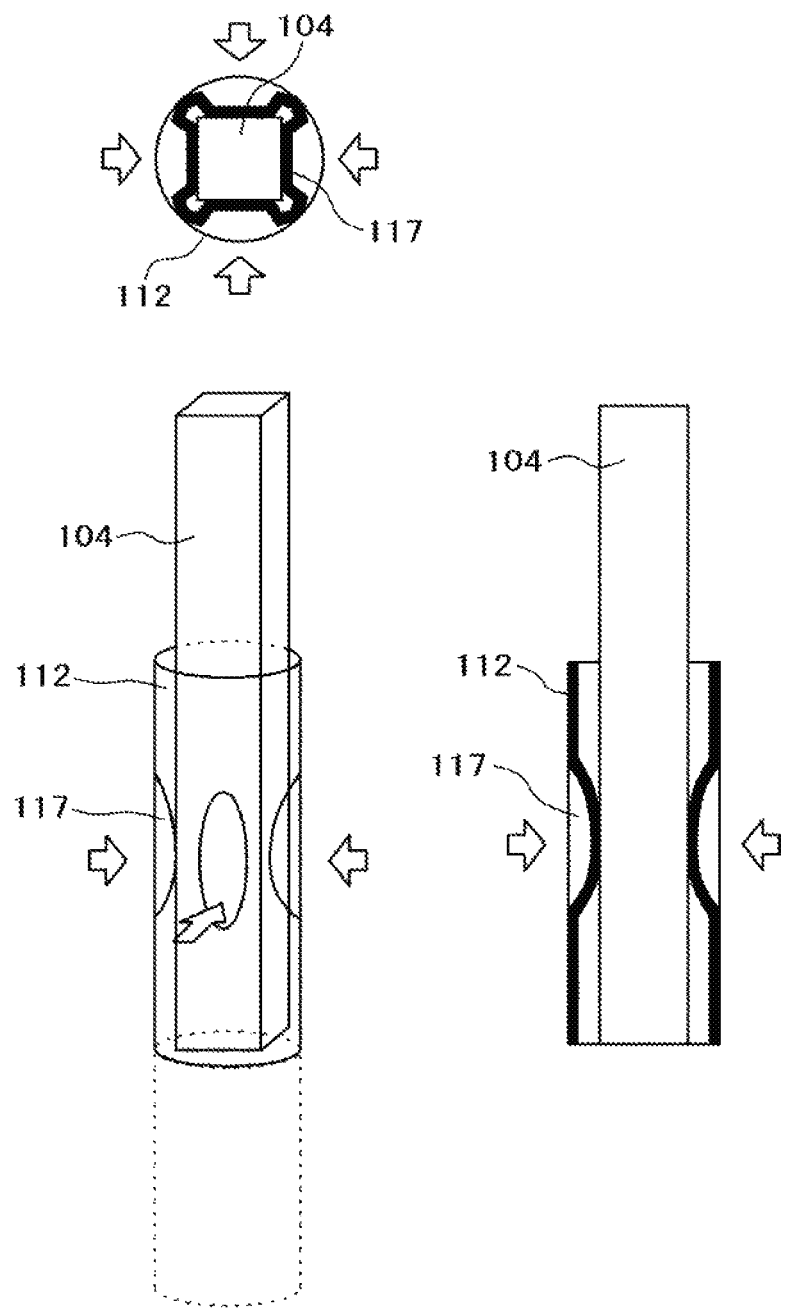
[FIG. 9]

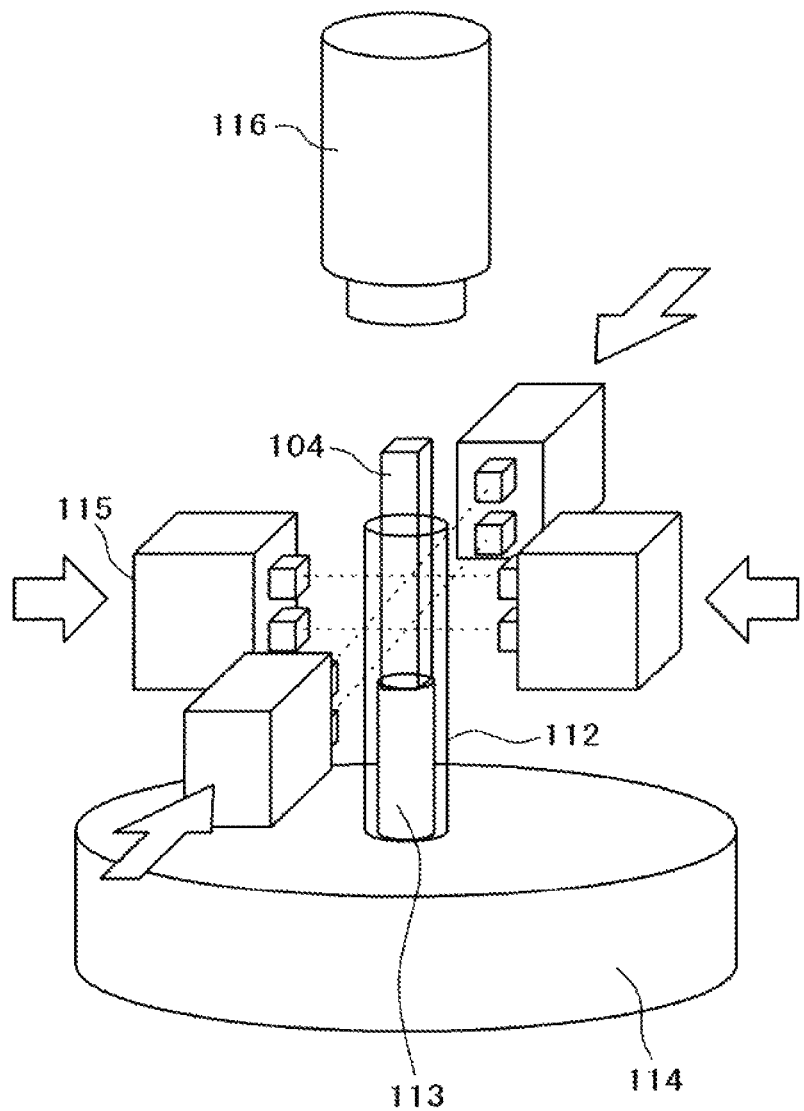
[FIG. 10]

[FIG. 11]
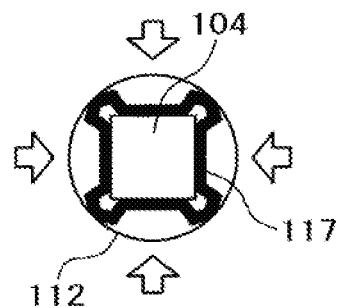
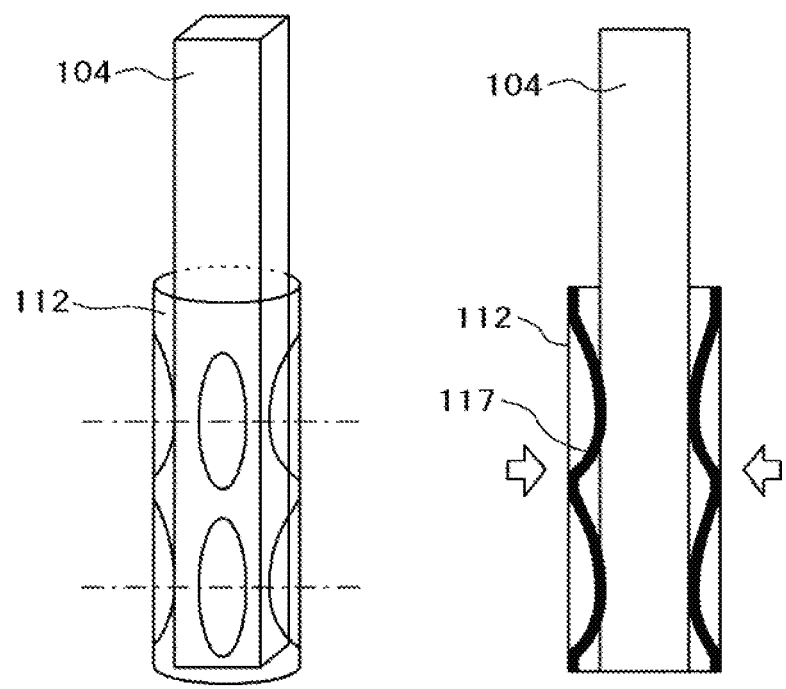

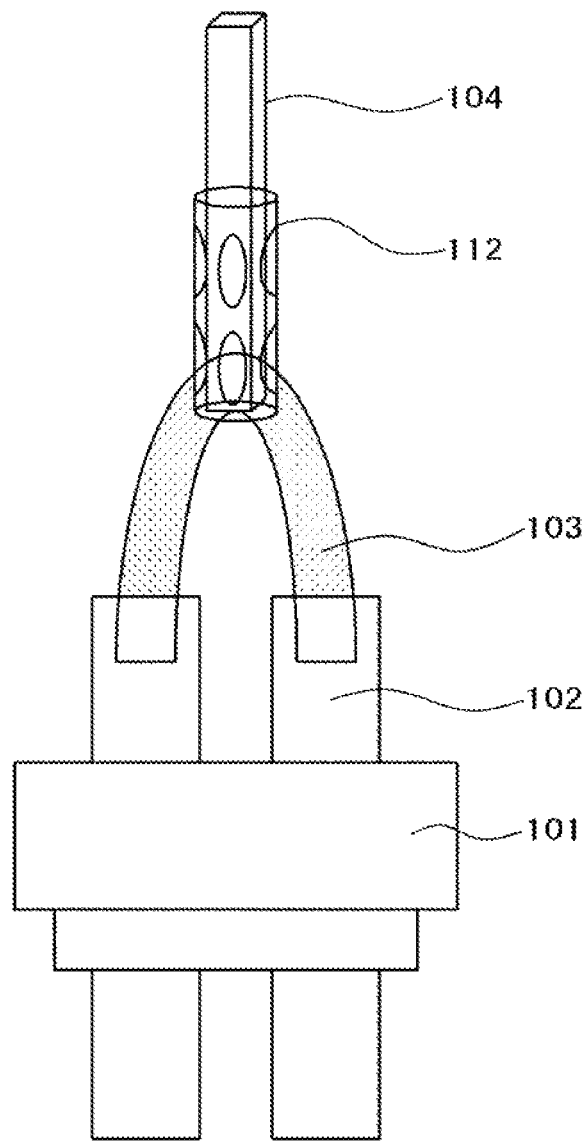
[FIG. 12]

[FIG. 13]
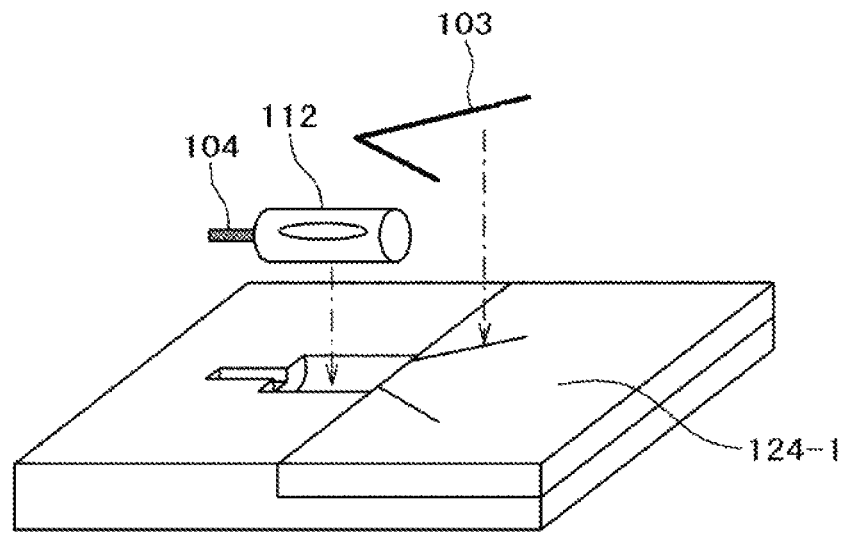
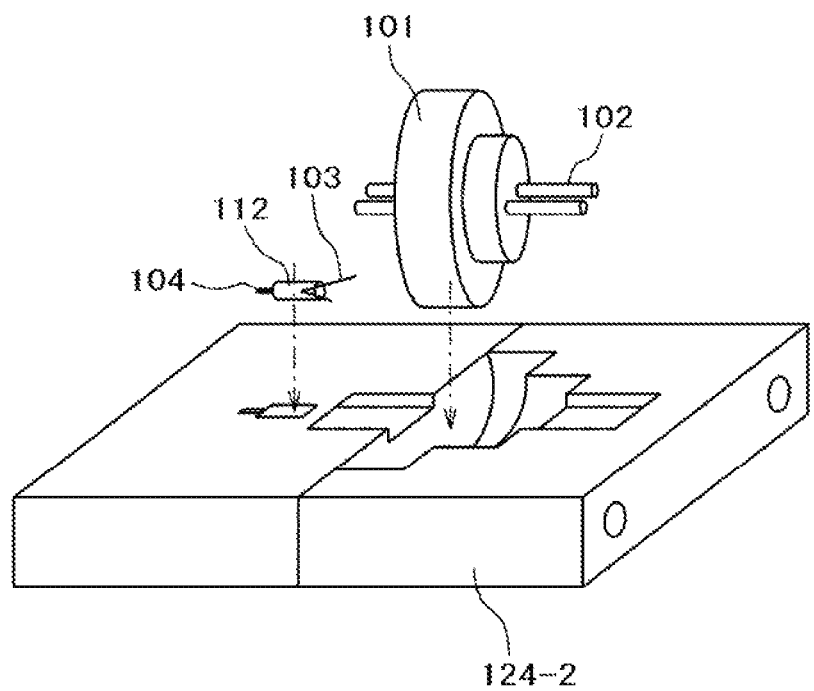

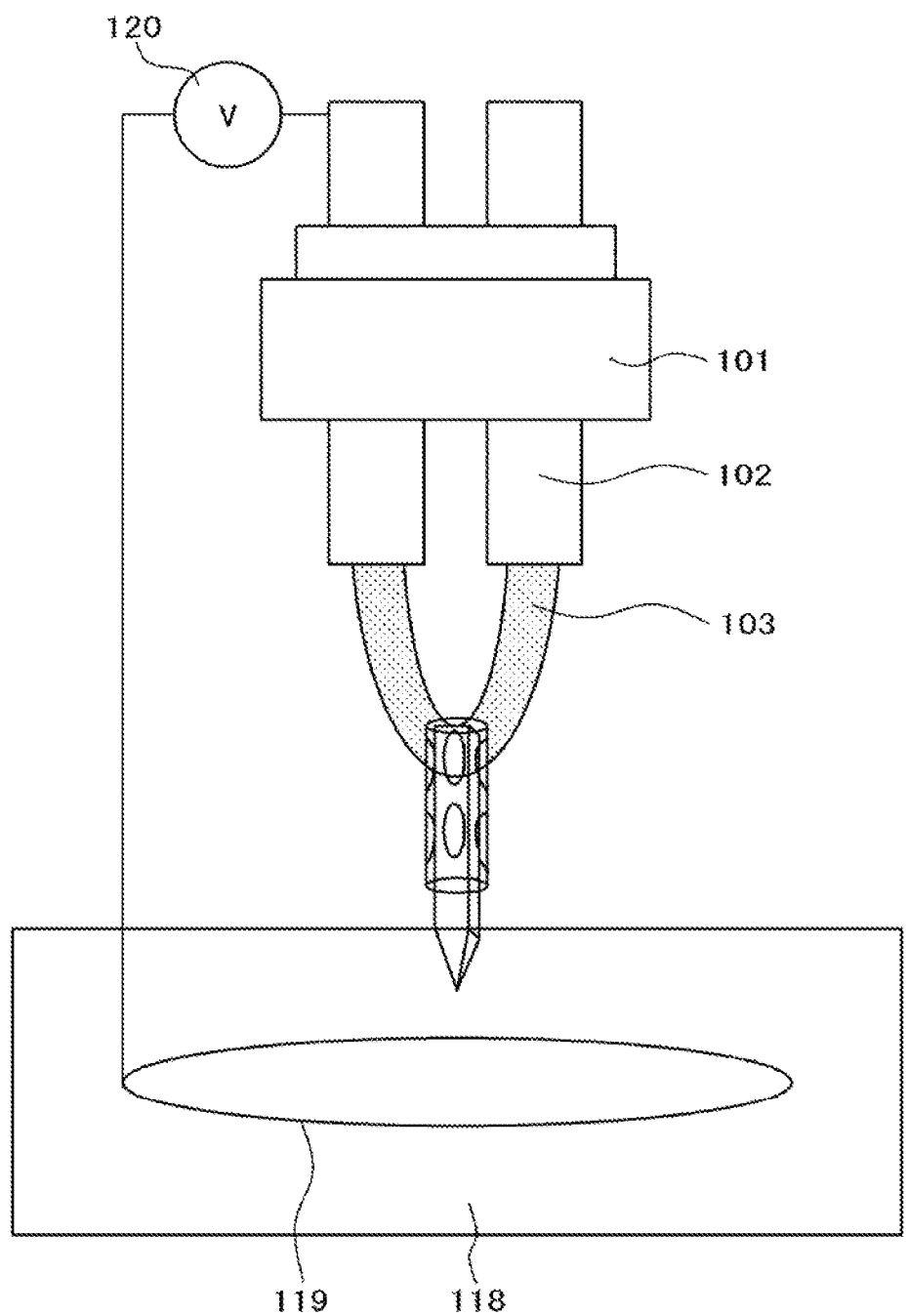
[FIG. 14A]

[FIG. 14B]
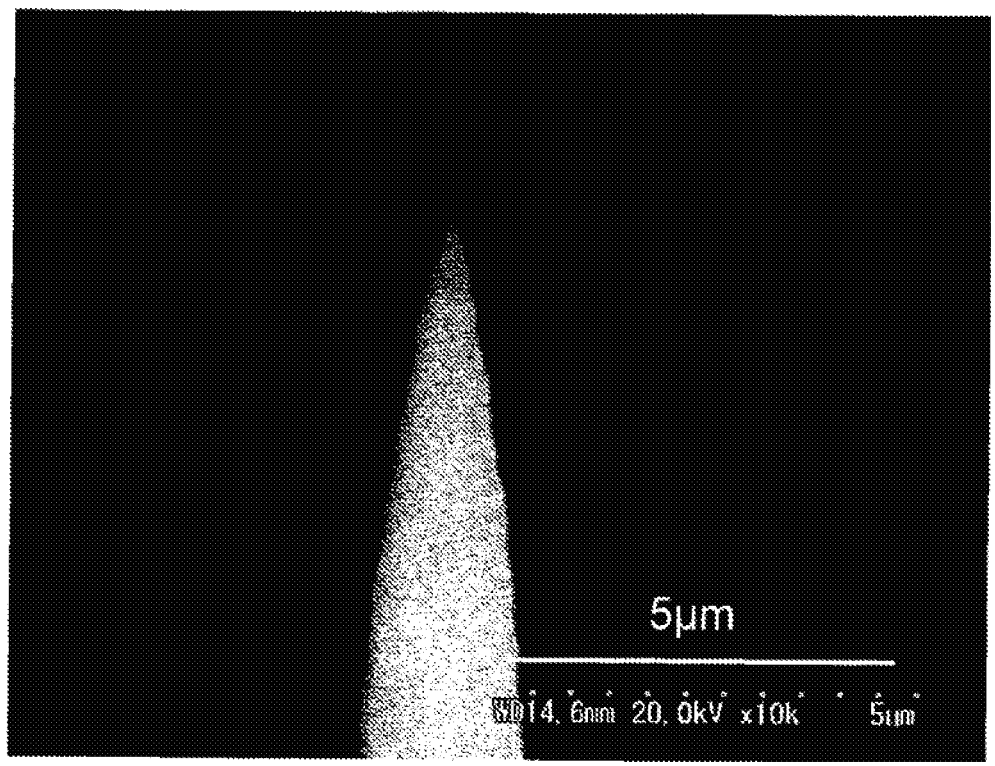

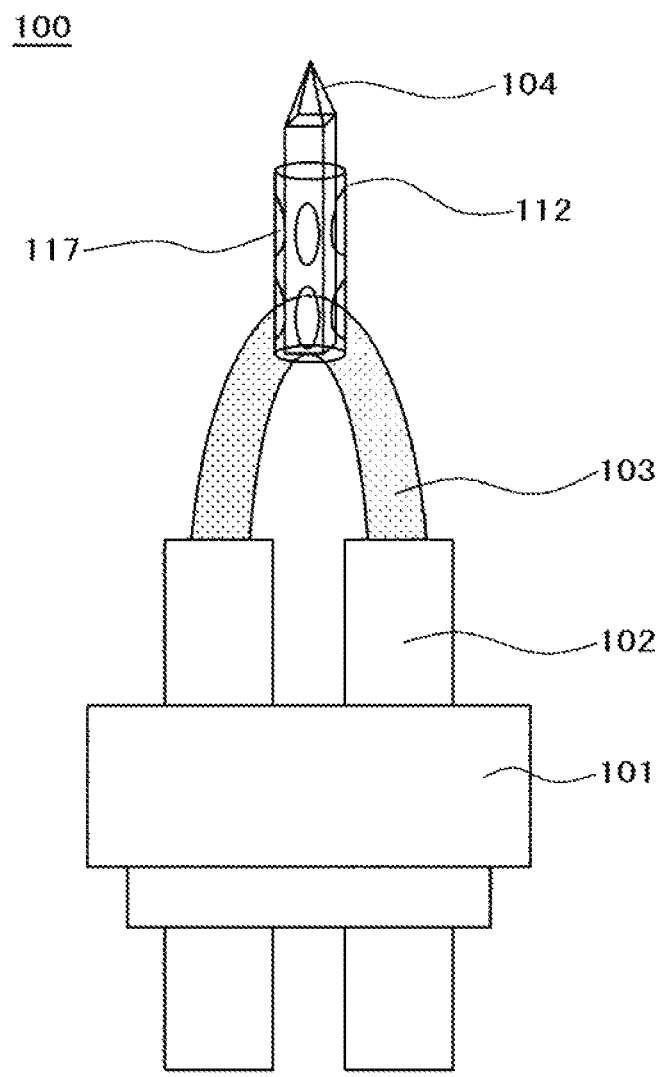
[FIG. 15]

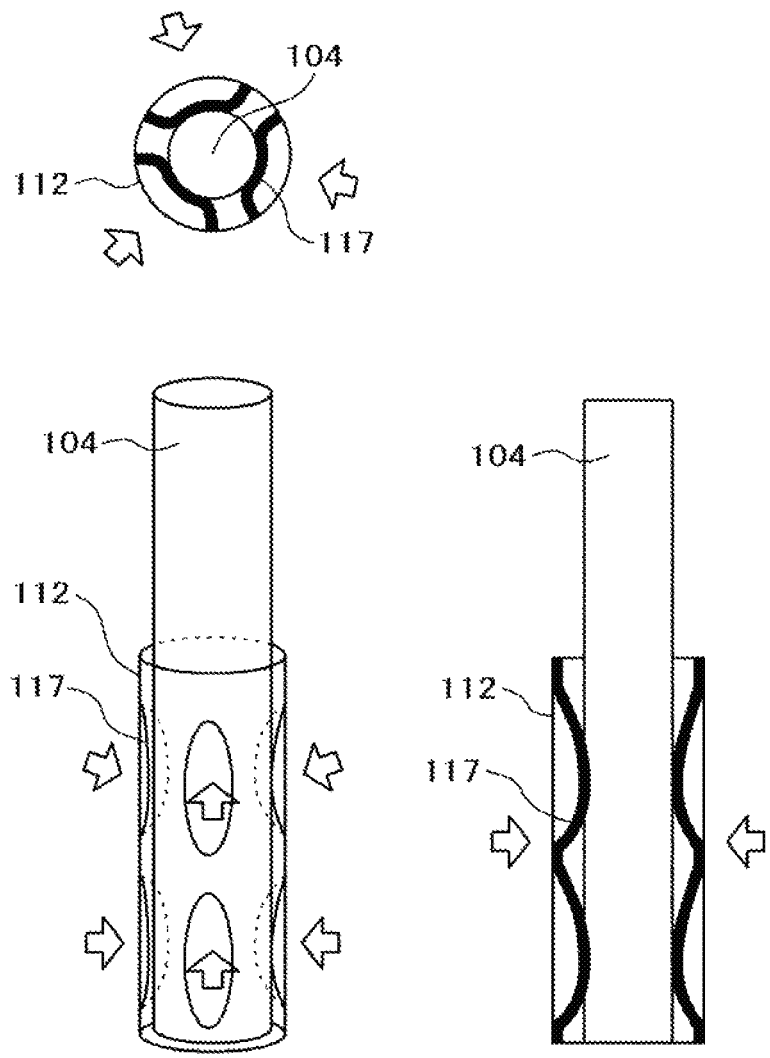
[FIG. 16]

[FIG. 17]
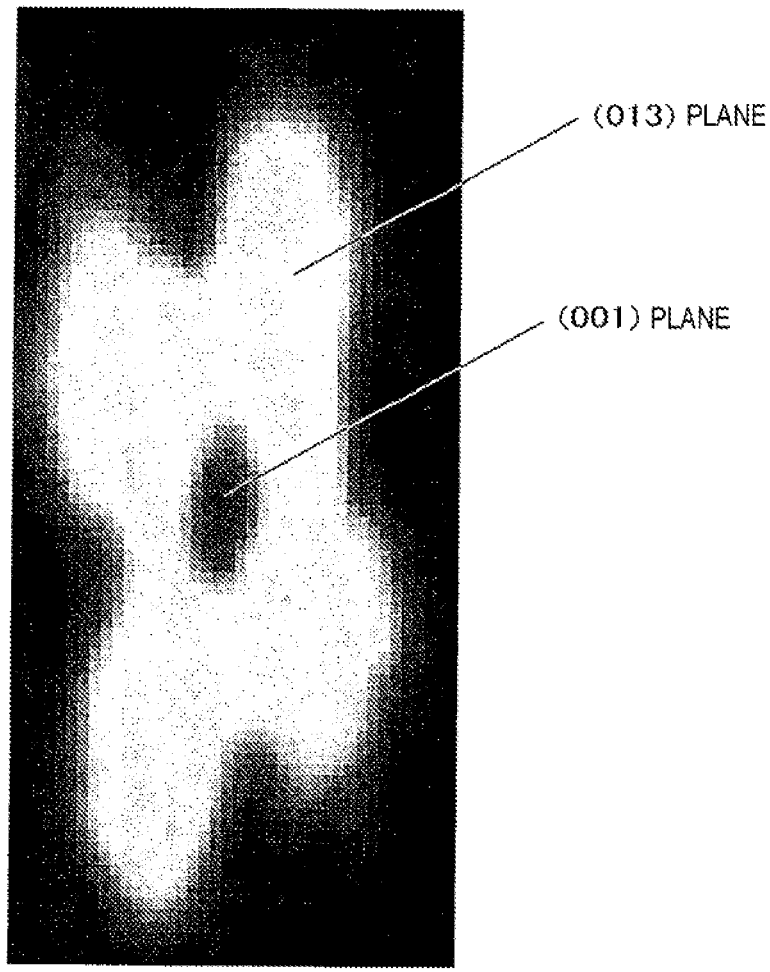

[FIG. 18]
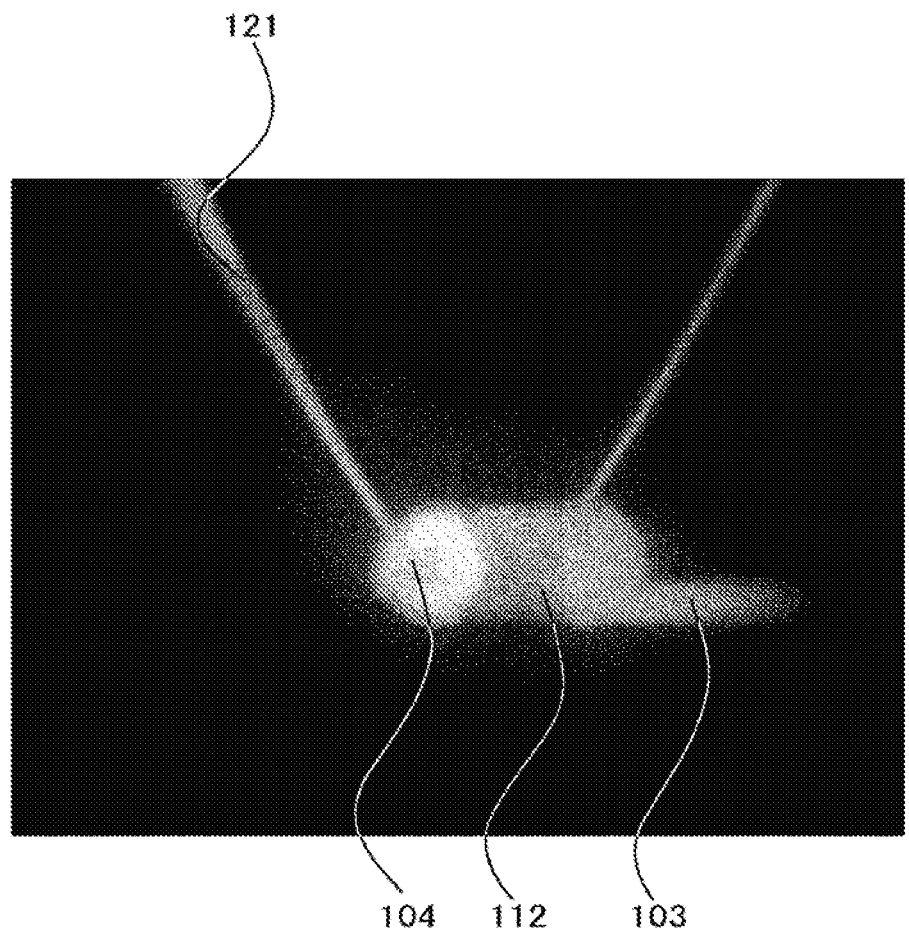

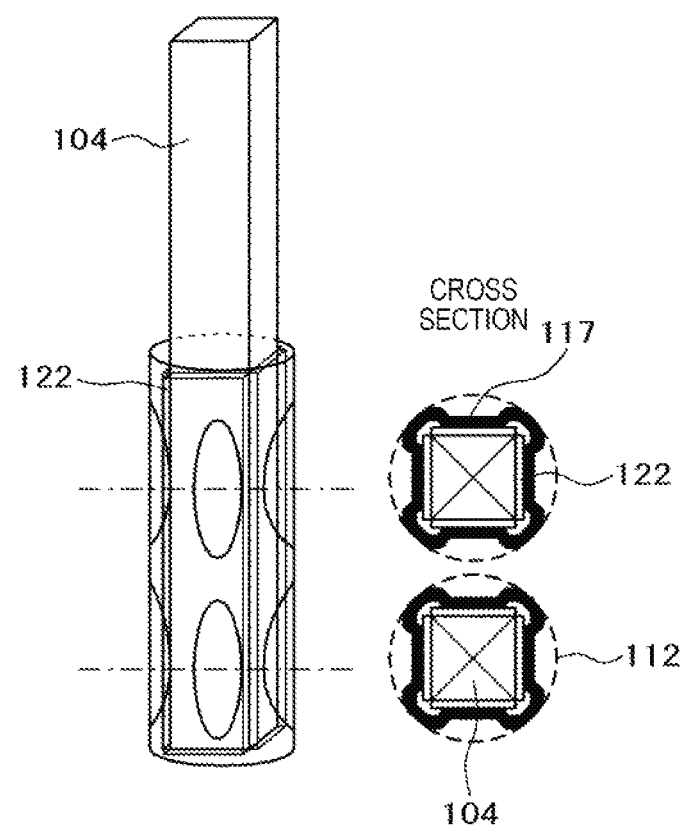
[FIG. 19]

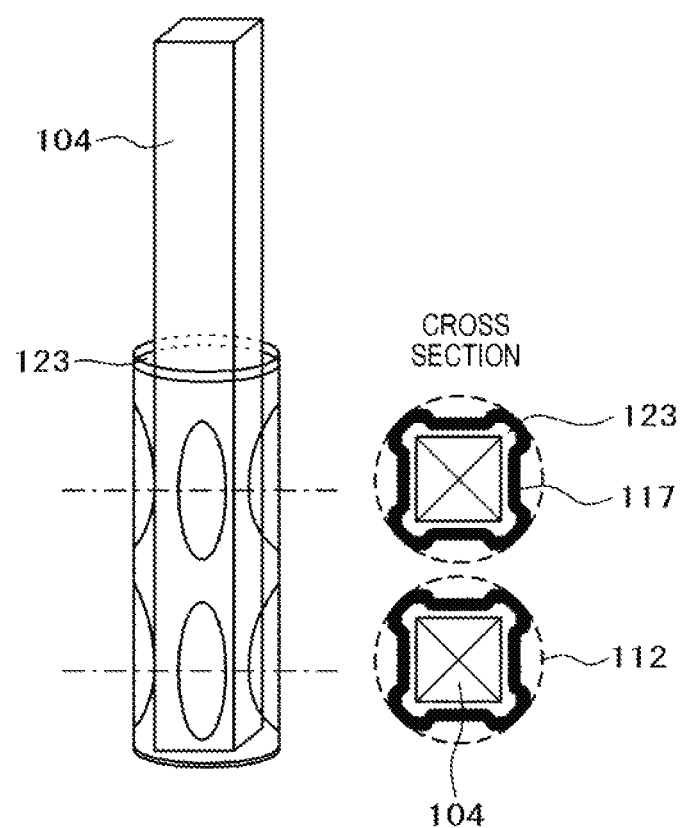

[FIG. 21]
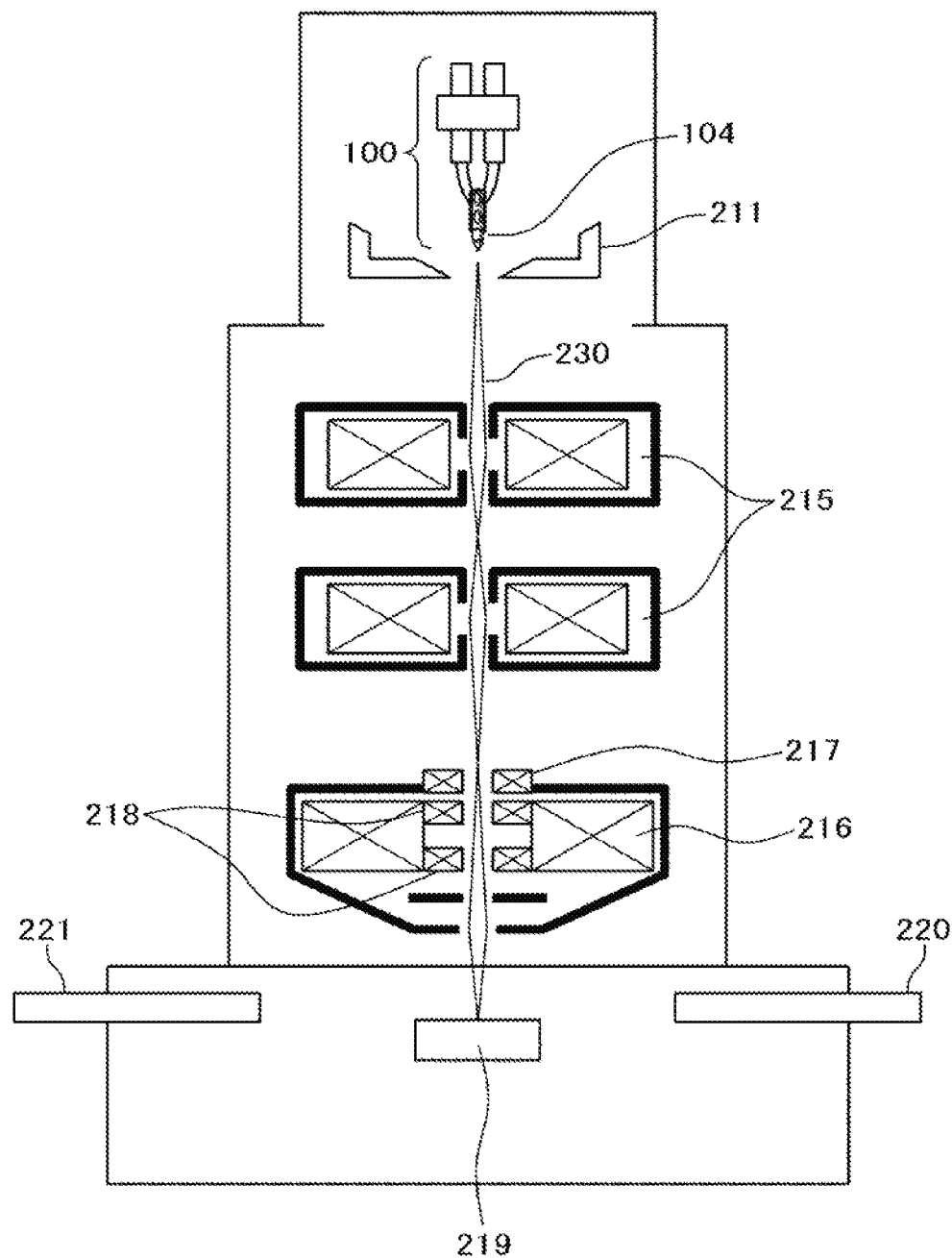

ELECTRON SOURCE AND ELECTRON BEAM DEVICE USING THE SAME

TECHNICAL FIELD

The present invention relates to an electron source and an electron beam device using the same.

BACKGROUND ART

As an electron source used for an electron beam device such as an electron microscope, there are a thermal electron source, a field emission electron source, a Schottky electron source, and the like. Energy diagrams demonstrating operation principles of the electron sources are respectively illustrated in FIGS. 1A to 1C. The thermal electron source illustrated in FIG. 1A heats a filament of tungsten (W) processed into a hairpin shape to about 2800 K and takes out an electron e into a vacuum by causing the electron thermally excited in W solid to cross a barrier of work function $\Phi$ (4.3 to 4.5 eV) of W. Since the electron source is always heated, it is possible to take out a stable electron beam with no contamination on the surface of the electron source and little current fluctuation. On the other hand, since the electron source is heated to a high temperature, an energy half width $\Delta E$ of emitted electrons is as wide as 3 to 4 eV, and electrons are emitted from the entire heated portion and thus, an electron emission area $\alpha$ is wide and brightness B (amount of emitted current per unit area or per unit solid angle) is as low as $10^5$ A/cm$^2$ sr. For that reason, a hexaboride electron source such as LaB$_6$ whose work function $\Phi$ is 2.6 eV lower than that of W is also used. The LaB$_6$ thermal electron source can reduce an operating temperature to about 1700 to 1900 K because the work function $\Phi$ of the LaB$_6$ thermal electron source is low. Therefore, the energy half width $\Delta E$ can be suppressed to 2 to 3 eV, and brightness B can also be raised to about $10^6$ A/cm$^2$ sr. In PTL 1 and PTL 2, thermal electron sources which heat the hexaboride to emit thermal electrons are disclosed. These electron sources are used, for example, as electron sources for low-resolution but easy to handle and inexpensive simple electron microscopes.

The field emission electron source illustrated in FIG. 1B is used as an electron source for a high resolution electron microscope because the field emission electron source has high mono-chromaticity and can emit a high brightness electron beam. A tungsten (W) tip with a sharpened tip is widely used as the field emission electron source. A high electric field is applied by concentrating an external electric field E to a tip end of the W tip, and the electron e in the W tip is quantum mechanically transmitted through an effectively thinned vacuum barrier and released into the vacuum. Since the field emission electron source can operate at room temperature, the energy half width $\Delta E$ of the electron e is as narrow as about 0.3 eV and electrons are emitted from a narrow electron emission area $\alpha$ of a very sharp tip end. Therefore, the field emission electron source is characterized by high brightness of $10^8$ A/cm$^2$ sr. In order to further narrow the energy width $\Delta E$ and increase brightness B even in the field emission electron source, a field emission electron source using a nanowire of hexaboride such as LaB6 having a low work function $\Phi$ has also been proposed (for example, PTL 3). Since LaB$_6$ has a lower work function barrier than W, it is possible to further reduce the half energy width $\Delta E$ at which field emission can be caused by allowing electrons to transmit in a lower electric field.

On the other hand, as illustrated in FIG. 1C, a Schottky electron source in which zirconium oxide (ZrO) is coated on a W tip is used in a length measurement scanning electron microscope for measuring dimensions of a semiconductor device. The Schottky electron source is always heated to about 1800 K, and in which ZrO thermally diffused to the tip end of the W tip lowers the work function $\Phi$ of the surface of the W tip to about 2.6 eV and thermoelectrons are emitted beyond the barrier (Schottky barrier) of the work function $\Phi$ reduced by the external electric field E applied to the tip end of the W tip and mirror image potential. The Schottky electron source can stably take out a larger current than that of the field emission electron source, but since the operating temperature is high, the half energy width $\Delta E$ becomes as large as about 0.5 to 1 eV.

CITATION LIST

Patent Literature

PTL 1: JP-B-56-30930
PTL 2: JP-A-01-7450
PTL 3: WO 2014/007121 A

SUMMARY OF INVENTION

Technical Problem

The thermal electron source and the Schottky electron source are always heated and used. On the other hand, if residual gas is adsorbed on the surface of the field emission electron source used at room temperature, since the residual gas moves an adsorption site on an electron emission surface, the work function fluctuates, and a problem such as generation of noise in an emission current occurs, periodic heating flushing (or annealing, hereinafter, referred to as heating flushing) is required. In order to prevent gas adsorption to the field emission electron source, it may be used as a thermal field emission electron source always heated at a relatively low temperature of about 1000 to 1300K. Accordingly, all the electron sources have a structure in which the tip of the electron source is joined to a filament that can be heated, except for the W thermal electron source in which the filament itself is the electron source. FIG. 2 illustrates a structure of a general electron source. A hairpin type filament 103 is joined to two electrode pins 102 of a stem 101, and a tip 104 of an electron source is further joined to a tip end of the hairpin type filament.

In the tungsten (W) field emission electron source, a W tip is joined by spot welding to a W hairpin type filament, and flashing treatment in which the filament is heated at a high temperature of 2300 to 2800 K or more for a short time of several seconds or annealing treatment in which the filament is heated at a slightly lower temperature for several minutes is conducted to desorb and clean gas on the surface of the electron source. Similarly, also in a ZrO/W Schottky electron source, the W tip is joined to a W filament by spot welding, and the ZrO/W Schottky electron source is used by applying ZrO powder at the root of the W tip and always heating to 1800 K. In these electron sources, the W filament and the W tip are both metal materials and can be easily spot-welded. In addition, since the metal materials are the same elements, even when heating is performed at high temperature, a problem that a joined part deteriorates due to formation of an intermetallic compound, or the like does not occur.

On the other hand, when a hexaboride such as $LaB_6$ is spot-welded to the W filament, an intermetallic compound is formed at a spot-weld part between the hexaboride and the W filament by heating to reduce strength. In addition, since the spot-welded part is a joined part of dissimilar materials having different thermal expansion coefficients, joining may be broken due to fatigue caused by thermal stress according to heating flushing.

In order to solve the problems, PTL 1 discloses a structure in which a reaction barrier layer such as a transition metal diboride is provided between the hexaboride and a supporting metal such as tantalum instead of spot welding the hexaboride directly to the W filament. However, PTL 2 points out a problem that joining strength between the reaction barrier layer and the hexaboride is insufficient and thus, when used for a long time, the hexaboride tip tends to fall off. In order to solve the problem, PTL 2 discloses an example in which a reaction barrier layer such as carbon, an intermediate layer such as a transition metal boride, and a support metal layer are directly laminated on a hexaborid, and the W filament is spot-welded to the support metal layer. However, this structure is a laminate of a deposited film, a sintered film, and a metal foil where the joined part of the electron source and the filament is about 5 to several tens of μm, and since mechanical strength is insufficient, there are concerns about problems to be solved such as damage to the tip when spot welding the W filament and deterioration of the joined part when used for a long time.

An object of the present invention is to provide an electron source that can be used stably for a long time even when using a hexaboride, and a high-brightness, high-resolution electron beam device using the electron source.

Solution to Problem

As an embodiment of the present disclosure to achieve the object described above, there is provided an electron source including;
 a filament made of a metal,
 a metal tube that is fixed to the filament and has a plurality of recesses disposed at least in two axial directions so as to surround a central axis at an outer periphery, and
 a columnar hexaboride tip that emits an electron, is disposed so as to protrude from the inside of the metal tube to a side opposite to the filament, and is in contact with a bottom of each of the plurality of recesses of the metal tube.

As another embodiment of the present disclosure, there is provided an electron beam device including;
 an electron source,
 a sample stand on which the sample is placed, and
 an electron optical system for irradiating a sample on the sample stand with an electron emitted from the electron source.

Advantageous Effects of Invention

According to the present invention, it is possible to provide an electron source which can be stably used for a long time even when using a hexaboride, and an electron beam device using the electron source.

BRIEF DESCRIPTION OF DRAWINGS

FIG. 1A is an energy diagram illustrating an operating principle of a thermal electron source used in an electron beam device such as an electron microscope.

FIG. 1B is an energy diagram illustrating an operation principle of a field emission electron source used for the electron beam device such as the electron microscope.

FIG. 1C is an energy diagram illustrating an operation principle of a Schottky electron source used for the electron beam device such as the electron microscope.

FIG. 2 is a structural diagram of a general electron source used for the electron beam device such as the electron microscope.

FIG. 3 is a perspective view illustrating a crystal structure (unit cell) of a hexaboride single crystal used in an electron source according to each example.

FIG. 4 is a perspective view illustrating an atom structure of a (013) plane of the hexaboride single crystal used in the electron source according to each example.

FIG. 5 is a schematic view illustrating a state in which a square pole tip 104 is cut out from a hexaboride single crystal along a (013) crystal axis.

FIG. 6 is a process flow diagram for explaining a manufacturing method of a metal tube in an electron source according to Example 1, the upper left view illustrates a process of preparing a metal sheet, and the upper right view illustrates a process of manufacturing a semi-seamless tube from the metal sheet, the lower view illustrates a process of manufacturing a metal pipe of a desired length by using a thin metal tube as the semi-seamless tube.

FIG. 7 is an assembled layout diagram of a metal tube and a hexaboride tip in a process of manufacturing an electron source according to Example 1.

FIG. 8 is a view for explaining a joining method of the metal tube and a hexaboride tip in the process of manufacturing the electron source according to Example 1.

FIG. 9 is a view for explaining a joining structure between the metal tube and the hexaboride tip in the process of manufacturing the electron source according to Example 1, and the upper view is a cross-sectional view at a joined part of the metal tube and the hexaboride tip, the lower left view is a perspective view illustrating the joining structure of the metal tube and the hexaboride tip, and the lower right view is a longitudinal cross-sectional view illustrating the joining structure.

FIG. 10 is a view for explaining another example of the joining method of the metal tube and the hexaboride tip in the process of manufacturing the electron source according to Example 1.

FIG. 11 is a view for explaining another example of the joining structure of the metal tube and the hexaboride tip in the process of manufacturing the electron source according to Example 1, and the upper view is a cross-sectional view at the joined part of the metal tube and the hexaboride tip, the lower left view is a perspective view illustrating the joining structure of the metal tube and the hexaboride tip, and the lower right view is a longitudinal cross section illustrating the joining structure.

FIG. 12 is a structural view illustrating a state where a metal tube to which a hexaboride tip is joined is joined to a filament and the filament is joined to an electrode of a stem in the process of manufacturing an electron source according to Example 1.

FIG. 13 is a view for explaining a positioning jig at the time of an assembly of the electron source according to Example 1, and the upper view is a perspective view of the jig for joining the metal tube to which the hexaboride tip is joined and the filament, and the lower view is a perspective view of a jig for joining the filament joined to the metal tube to which the hexaboride tip is joined and the electrode of the stem.

FIG. 14A is a view for explaining a process of sharpening a tip end of the tip by electrolytic polishing in the process of manufacturing the electron source according to Example 1.

FIG. 14B is a SEM image illustrating a state in which the tip end of the tip of the electron source according to Example 1 is sharpened by electrolytic polishing.

FIG. 15 is a structural diagram of the electron source according to Example 1.

FIG. 16 is a view for explaining another example of the joining structure of the metal tube and the hexaboride tip in the electron source according to Example 1, and the upper view is a cross-sectional view at the joined part of the metal tube and the hexaboride tip, the lower left view is a perspective view illustrating the joining structure of the metal tube and the hexaboride tip, and the lower right view is a longitudinal cross-sectional view illustrating the joining structure.

FIG. 17 is a field emission microscopic image obtained from the hexaboride electron source tip of the electron source according to Example 1.

FIG. 18 is a photograph illustrating a state of continuous heating of the hexaboride electron source tip of the electron source according to Example 1.

FIG. 19 is a view for explaining a joining structure of a metal tube and a hexaboride tip in an electron gun according to Example 2, and the left view is a perspective view illustrating the joining structure of the metal tube and the hexaboride tip and the right view is a cross-sectional view in the joined part of the metal tube and the hexaboride tip.

FIG. 20 is a view for explaining another joining structure of the metal tube and the hexaboride tip in the electron gun according to Example 2, and the left view is a perspective view illustrating the joining structure of the metal tube and the hexaboride tip and the right view is a cross-sectional view in the joined part of the metal tube and the hexaboride tip.

FIG. 21 is a schematic overall configuration sectional view of an electron beam device (scanning electron microscope equipped with a hexaboride electron source) according to Example 3.

DESCRIPTION OF EMBODIMENTS

As a result of investigations by the inventors, it was found that, particularly when manufacturing a field emission electron source of hexaboride or a thermal field emission electron source of hexaboride, a more robust and reliable joining in which a tip does not fall off even when the electron source is heated for a long time can be achieved by providing a plurality of recesses from at least two axial directions so as to surround a central axis of a metal tube made of tantalum or niobium and a hexaboride tip disposed inside thereof, at an outer periphery of the metal tube and bringing respective bottoms of the plurality of recesses into contact with an outer periphery of the hexaboride tip, respectively. More preferably, it was found that a plurality of recesses are also provided at points which are on the outer periphery of the metal tube and deviated in the axial direction of the metal tube and the bottoms of the respective recesses are in contact with the outer periphery of the hexaboride, respectively, thereby capable of obtaining a more robust joining without optical axis deviation.

It was found that, particularly when manufacturing a thermal electron source of hexaboride or a Schottky electron source of hexaboride, a more robust and reliable joining can be achieved in which a tip does not fall off even when the electron source is heated for a long time by providing a plurality of recesses from at least two axial directions so as to surround a central axis of a metal tube made of tantalum or niobium, a hexaboride tip disposed inside thereof, and a graphite sheet or rhenium foil inserted therebetween, at an outer periphery of the metal tube and bringing respective bottoms of the plurality of recesses into contact with a graphite sheet or rhenium foil on an outer periphery of the hexaboride tip, respectively. More preferably, it was found that a plurality of recesses are also provided at points which are on the outer periphery of the metal tube and deviated in the axial direction of the metal tube and the bottoms of the respective recesses are in contact with a graphite sheet or rhenium foil on the periphery of the hexaboroid, respectively, thereby capable of obtaining a more robust joining without optical axis deviation.

It was found that, particularly when manufacturing a thermal electron source of hexaboride or a Schottky electron source of hexaboride, a more robust and reliable joining can be achieved in which a tip does not fall off even when the electron source is heated for a long time by providing a plurality of recesses from at least two axial directions so as to surround a central axis of a metal tube made of tantalum or niobium, a hexaboride tip disposed inside thereof, and glassy carbon inserted therebetween, at an outer periphery of the metal tube and bringing respective bottoms of the plurality of recesses into contact with glassy carbon or a mixture of glassy carbon and boride carbon coating the outer periphery of the hexaboride, respectively. More preferably, it was found that a plurality of recesses are also provided at points which are on the outer periphery of the metal tube and deviated in the axial direction of the metal tube and the bottoms of the respective recesses are in contact with glassy carbon or a mixture of glassy carbon and boride carbon coating the outer periphery of the hexaboride, respectively, thereby capable of obtaining a more robust joining without optical axis deviation.

Hereinafter, the present invention will be described by way of examples with reference to the drawings. In the following drawings, in order to make the configuration of the invention easy to understand, a perspective view is partially used, a thick line is used, and the scale of each configuration is appropriately changed.

EXAMPLE 1

Example 1 will be described with reference to FIGS. 3 to 15 with respect to a structure of an electron source when hexaborides are used as a field emission electron source, and a manufacturing method of the electron source.

First, hexaborides of rare earth metals and alkaline earth metals are used as materials for field emission electron sources. Specifically, lanthanoid elements such as La, Ce, Pr, Nd, Sm, Eu, Gd, and the like, alkaline earth metals such as Ca, Sr, Ba, and the like can be used, and the materials for field emission electron sources are represented by chemical formulas of $LaB_6$, $CeB_6$, $PrB_6$, $NdB_6$, $SmB_6$, $EuB_6$, $GaB_6$, $CaB_6$, $SrB_6$, $BaB_6$, and the like, respectively.

A unit lattice is illustrated in FIG. 3. The unit lattice has a crystal structure in which blocks of six boron atoms 202 are positioned in a body center of a simple cubic lattice of metal atoms 201. These materials, particularly materials using rare earths, generally have a high melting point, low vapor pressure, high hardness, and high resistance to ion bombardment, and are suitable as materials of electron sources having a work function lower than W. In particular, since $CeB_6$ has high use results as a thermal electron source together with $LaB_6$, has f-electrons with strong energy localization in the valence band, and has a higher density of electronic states just below the Fermi level than $LaB_6$, $CeB_6$ has a large amount of current drawn by field emission and is suitable as a hexaboride material for a field emission electron source.

If these hexaborides are used, for example, by melt (liquid phase) crystal growth using a floating zone method or the like, a large single crystal 105 of several tens of mm in length grown in the (001) plane direction of a crystal habit plane where the diameter is several mm and crystals preferentially grow. When the hexaboride is used in a thermal electron source, the single crystal 105 is cut into tips of several hundred μm square and several mm in length by cutting, and the (001) plane is used as an electron emission surface. The crystal structure of the hexaboride is a simple cubic lattice as illustrated in FIG. 3, and the (001) plane is equivalent to the (100) plane or the (010) plane. In Example 1, for the sake of convenience, the c-axis of FIG. 3 and the (001) plane of FIG. 3 which is the c-plane are defined as a crystal habit surface, respectively, and the following description will be made.

As a result of investigations by the inventors, it has been found that, when the hexaboride is used as the field emission electron source, it is preferable to use the (013) plane which has a work function lower than the (001) plane and in which high brightness electron emission can be obtained. FIG. 4 illustrates an atom structure of the (013) plane.

First, the crystal axis of the hexaboride single crystal 105 was measured by the X-ray Laue method or the like, and the tip 104 was cut out along the (013) crystal axis by cutting, that is, at an angle of 18.4° to the long axis of the hexaboride single crystal 105. Although a cross-sectional shape of the tip 104 to be cut out is arbitrary, it is preferable to cut out the tip in the shape of a square pole or a circular cylindrical shape. In this example, the tip 104 processed into a square pole with a side of 200 μm and a length of 5 mm was cut out. FIG. 5 schematically illustrates a state in which the square pole tip 104 is cut out from the single crystal 105 along the (013) crystal axis.

Subsequently, in the electron source according to this example, a method of manufacturing the metal tube used for joining with the tip 104 will be described. A manufacturing process of a metal tube 112 is illustrated in FIG. 6. The material of the metal tube 112 which is a high melting point metal such as tantalum or niobium, and is rich in ductility, facilitates manufacturing of a minute metal tube by means of an expansion tube, and has quality facilitating processing of a recess described later is suitable. In this example, tantalum was used as an example.

First, as illustrated in the upper left diagram of FIG. 6, a metal sheet of tantalum is prepared. Next, as illustrated in the upper right view of FIG. 6, a metal sheet 106 of tantalum is rounded, and both ends of the metal sheet 106 are electron beam welded to manufacture a semi-seamless tube 108 of tantalum having a large diameter. The reference numeral 107 indicates an electron beam welded-part. Subsequently, as illustrated in the lower view of FIG. 6, a metal pipe 110 having an outer diameter of Φ 0.6 mm, an inner diameter of Φ 0.4 mm, and a thickness of 0.1 mm is manufactured by repeatedly performing drawing and extension pipe processing using a die 109. Further, the metal pipe was cut every 5 mm with a cutter 111 to manufacture the minute metal tube 112.

In this example, as described later, since the tip 104 of the electron source is inserted into the metal tube 112 and then joined, the inner diameter of the metal tube 112 is preferably about 1.1 to 1.5 times the maximum diameter of the tip. If the inner diameter of the metal tube is 1.1 times or more, processing tolerance of the tip 104 is usually about 10% and thus, the number of tips 104 that cannot be inserted into the metal tube 112 increases, and a manufacturing yield of the electron source decreases.

On the other hand, if the inner diameter of the metal tube is 1.5 times or more, a dimensional difference between the tip 104 and the inner diameter of the metal tube 112 becomes too large, and a deformation amount of the metal tube 112 in the process of forming and joining a recess described later is large, and a decrease in an assembly accuracy and a decrease in strength, and an increase in power consumption and a decrease in heating response due to increase of heat capacity depending on a volume increase of the metal tube 112 are caused. Accordingly, in the case of the tip 104 having a side of 200 μm (square pole having a maximum diameter of about 282 μm), the inner diameter of the metal tube 112 is preferably about 310 to 423 μm. In this example, the inner diameter of the metal tube 112 is 400 μm.

In this example, as described later, since it is necessary to perform spot welding of a filament to the metal tube 112 and it is necessary to withstand high temperature heating during operation for a long time, the metal tube 112 needs to have sufficient strength. For that reason, the thickness of the metal tube is preferably 100 μm or more. On the other hand, when the thickness is too thick, since the heat capacity of the metal tube 112 is increased to cause an increase in heating power and a decrease in heating response of the electron source, the thickness is preferably 200 μm or less. In this example, the thickness is 100 μm.

Subsequently, a joining method of this example will be described.

First, as illustrated in FIG. 7, the metal tube 112 is vertically erected using a pedestal 114 on which a guide pin 113, which has a diameter capable of being inserted inside the metal tube 112 and is shorter than the metal tube, is vertically erected. Furthermore, the hexaboride tip 104 is inserted from the top of the metal tube 112. In this example, a guide pin having a diameter of 350 μm and a length of 1 to 3 mm was used.

By adjusting the length of the guide pin 113, the length by which the hexaboride tip 104 protrudes from the inside of the metal tube 112 can be controlled. For example, in the case of producing the field emission electron source or the Schottky electron source, a protrusion amount of the tip is made longer from 2 to 3 mm in order to grind the hexaboride tip 104 by electrolytic polishing as described later. On the other hand, in the case of manufacturing a thermal electron source, a protrusion amount of about 1 to 2 mm is sufficient.

Subsequently, as illustrated in FIG. 8, the hexaboride tip 104 and the metal tube 112 are pressure-welded with a tool from two orthogonal axes and four directions in a plane perpendicular to the vertical direction of the hexaboride tip 104. FIG. 8 illustrates only a portion of a blade 115 of a pressure-welding tool for explanation. Projections for forming a recess in the metal tube 112 are provided at the tip end of the blade 115 of the pressure-welding tool, and is brought close to the metal tube 112 with equal stroke from two axes and four directions and crushed from the outer periphery of the metal tube 112 to form the recess. The four arrows indicate moving directions of the blade 115 of the pressure-welding tool when the hexaboride tip 104 and the metal tube 112 are pressure-welded.

FIG. 9 is a schematic view of the hexaboride tip 104 and the metal tube 112 joined by the method of this example. The upper view of FIG. 9 illustrates a cross-sectional view of the joined part viewed from a tip end side of the hexaboride tip 104, and the lower left view of FIG. 9 is a perspective view illustrating the joining structure of the metal tube and the hexaboride tip, the lower right view of FIG. 9 illustrates a vertical cross-sectional view of the center in the vertical direction of the hexaboride tip 104 illustrating the joining structure of the tip. The arrows indicate the moving direction of the blade 115 of the pressure-welding tool when the hexaboride tip 104 and the metal tube 112 are pressure-welded.

During operation, a positional relationship between the metal tube 112 and the hexaboride tip 104 is confirmed with a stereomicroscope 116, and a rotation axis of the hexaboride tip 104 is appropriately adjusted so that each side surface of the hexaboride tip 104 of a square pole coincides with a stroke direction of the blade 115 of the tool. With this configuration, a plurality of recesses 117 are formed so as to surround the central axis from the outer periphery of the metal tube 112, the bottom of each recess 117 is brought into contact with the outer peripheral surface of the hexaboride tip, and as a result, the hexaboride tip 104 can be automatically aligned with the central axis of the metal tube 112 and fixed.

By using this joining method, the metal tube 112 and the hexaboride tip 104 can be uniformly pressure-welded by the recesses 117 formed in two axes and four directions, and mechanically strong joining can be obtained. Since the projections are brought close to the metal tube 112 with equal strokes from two axes and four directions and the metal tube 112 is crushed from the outer periphery thereof to form the recesses 117, the hexaboride tip 104 of the square pole shape can be automatically aligned with and joined to the central axis of the metal tube 112. Assembling accuracy is improved and thus, optical axis alignment of the electron source is facilitated and the yield is also improved. Since a dotted line portion (lower left view of FIG. 9) where the guide pin 113 is inserted is not necessary, it is preferable to cut the portion with a cutter in order to reduce the heat capacity of the metal tube 112.

FIG. 10 is an improved example for obtaining a joining method by which a more robust and more precise optical axis alignment is possible. In this improved example, the projection portions of the blade 115 of the pressure-welding tool are divided into two stages of upper and lower stages, and the recess 117 is formed also at a position deviated in the axial direction of the metal tube 112. FIG. 11 is a schematic view of the joined hexaboride tip 104 and the metal tube 112. The upper view of FIG. 11 is a cross-sectional view of the joined part viewed from the tip end side of the hexaboride tip 104, and the lower left view of FIG. 11 is a perspective view illustrating the joining structure of the metal tube and the hexaboride tip, the lower right view of FIG. 11 is a vertical cross-sectional view of the center in the vertical direction of the hexaboride tip 104 illustrating the joining structure thereof. The arrows indicate the moving direction of the blade 115 of the pressure-welding tool when the hexaboride tip 104 and the metal tube 112 are pressure-welded.

Since the hexaboride tip and the metal tube are joined at points of the recesses 117 deviated in the axial direction and thus, the joining strength is further increased. Also, the hexaboride tip and the metal tube are joined at two points in the axial direction and thus, there is an effect that the tip can be prevented from being inclined at the joining part and accuracy of optical axis alignment can be further enhanced. Although the number of stages is not limited, if there are too many stages, since the metal tube 112 necessary for forming the recesses becomes long and the heat capacity is increased, it is desirable to use about two stages.

Subsequently, as illustrated in FIG. 12, the metal tube 112 to which the hexaboride tip 104 is joined is directly spot-welded to the filament 103 made of tungsten or the like, and both ends of the filament 103 are spot-welded to the electrode pins 102 of the stem 101. Since these spot welding correspond to metal-to-metal joining, it is possible to easily obtain robust joining by spot welding. At the time of spot welding, as illustrated in the upper view of FIG. 13, first, the metal tube 112 and the filament 103 made of tungsten or the like are accurately positioned and spot-welded using a positioning jig 124-1. Subsequently, as illustrated in the lower view of FIG. 13, since the central axes of the metal tube 112 and the hexaboride tip 104 are aligned by accurately positioning the stem 101 and the metal tube 112 using a positioning jig 124-2 and spot-welding the filament 103 and the electrode pin 102, highly accurate optical axis alignment is possible. With this configuration, it becomes possible to provide a hexaboride electron source in which a hexaboride-based tip can be firmly joined to a mechanically strong metal tube and which can be stably used for a long time even if the hexaboride electron source is heated. It is possible to provide a manufacturing method of a hexaboride electron source which is improved in assembling accuracy and has easy optical axis alignment.

Subsequently, the tip end of the hexaboride tip is sharpened by electrolytic polishing. As illustrated in FIG. 14A, electrolytic polishing can be performed by dipping the tip end of the assembled hexaboride tip 104 into an electrolyte solution 118 such as nitric acid and by applying an AC or DC voltage between the tip end and a ring-shaped counter electrode 119 such as platinum using a power supply 120. FIG. 14B is an example of a SEM photograph of the hexaboride tip subjected to electrolytic polishing. It can be seen that the tip end of the hexaboride tip is sharpened by electrolytic polishing. Through the processes described above, an electron source 100 illustrated in FIG. 15 is completed.

Thus, a basic structure of the hexaboride field emission electron source according to this example can be completed.

In the example described above, the hexaboride tip 104 cut into a square pole was used. The hexaboride tip 104 can also be processed into a circular cylindrical shape. FIG. 16 illustrates an example in which the cylindrical tip 104 is used. The upper view of FIG. 16 illustrates a cross-sectional view of the joined part viewed from the tip end side of the hexaboride tip 104, and the lower left view of FIG. 16 illustrates a perspective view illustrating the joining structure of the metal tube and the hexaboride tip, the lower right view of FIG. 16 illustrates a vertical cross-sectional view of the center in the vertical direction of the hexaboride tip 104 illustrating the joining structure of the metal tube and the hexaboride tip. When joining the cylindrical hexaboride tip 104 and the metal tube 112, the metal tube and the hexaboride tip may be pressure-welded by a tool from at least three equally spaced axes and three directions in a plane perpendicular to the vertical direction of the hexaboride tip 104. Similarly, as in the case of the square pole tip 104, the metal tube and the hexaboride tip can be joined from two axes or four directions. The arrows in the upper view and the lower right view of FIG. 16 indicate the moving direction of the entire blade 115 of the pressure-welding tool when the hexaboride tip 104 and the metal tube 112 are pressure-welded, and the arrows in the lower left view of FIG. 16 indicates the moving direction of the projections of the blade of the pressure-welding tool.

Subsequently, this electron source is introduced into a vacuum device to perform surface activation of the hexaboride field emission electron source. Since an oxide and the like are formed on the surface of the hexaboride tip subjected to electrolytic polishing, it is not possible to obtain electron emission as it is. Therefore, first, a positive high electric field is applied to the surface of the hexaboride tip, oxides and the like are removed by field evaporation to clean the surface.

Furthermore, by performing heat annealing at about 1400 to 1800 K for several minutes, field emission with the (013) plane as an electron emission surface can be obtained. FIG. 17 illustrates a result of having observed an electron emission surface pattern obtained from the hexaboride field emission electron source according to this example with the field emission microscope (FEM).

Four-fold symmetrical bright electron emission is obtained. The dark part in the center of the photograph is the (001) plane, and the bright part is the (013) plane and the crystal plane equivalent thereto.

In this example, the recess 117 of the metal tube 112 such as tantalum or niobium and the hexaboride tip 104 are brought into direct contact and joined. For that reason, when the joined part is heated, an intermetallic compound is formed, which may deteriorate the joined part. However, as a result of investigations by the inventors, it was found that, when being used as a field emission electron source, although it is necessary to heat for several minutes at a high temperature of about 1400 K to 1800 K only at first surface cleaning immediately after producing a tip of the electron source, a low temperature of about 1100 K to 1300 K may be sufficient for a flushing or low temperature annealing treatment to prevent gas adsorption thereafter. For that reason, it was found that reaction of the hexaboride with tantalum, niobium, and the like is slow, the amount of a formed intermetallic compound is very small, and there is no decrease in the joining strength due to heating. FIG. 18 illustrates a photograph at the time of continuously heating the electron source according to this example and investigating durability. A portion which is shining in a U-shape from above is the filament of a colorimetric thermometer 121. From this test, it was confirmed that the structure of the hexaboride electron source according to this example had a durability of 3 years or more and could be practically used at heating of 1300 K.

As described above, according to this example, it is possible to provide an electron source which can be used stably for a long time even when a hexaboride is used. It is possible to provide a joining structure optimum for the hexaboride in the field emission electron source and a method of manufacturing the joining structure. It is possible to provide a joining method capable of accurately setting optical axis alignment of a minute tip of hexaboride, and to improve the yield of manufacturing the electron source.

EXAMPLE 2

The electron source according to this example will be described with reference to FIGS. 19 and 20 and a part of the figures of Example 1. The matters described in Example 1 but not described in this example can be applied to this example, unless there are special circumstances.

In this example, a thermal electron source of hexaboride and a Schottky electron source of hexaboride will be described. When the hexaboride is used as a thermal electron source and the Schottky electron source, an operating temperature needs to be raised to a temperature at which thermal electrons can be emitted, and a temperature at which a Schottky barrier can be formed. For that reason, in the structure of Example 1, there is a concern that reaction between the metal tube 112 of tantalum, niobium or the like and the hexaboride tip 104 proceeds to deteriorate the joined part. Therefore, a structure and method of preventing formation of an intermetallic compound and deterioration of a joined part, by continuous use at a strong joining structure and a high temperature, which are improved from Example 1, are described.

The first is a method of inserting a graphite sheet or a metal foil of rhenium as a reaction barrier sheet 122 between the metal tube 112 and the tip 104 of hexaboride to be joined. FIG. 19 is a layout view of the metal tube 112, the hexaboride tip 104, and the reaction barrier sheet 122, and the left view is a perspective view illustrating the joining structure of the metal tube and the hexaboride tip, and the right view is a cross-sectional view at the joined part of the metal tube and the hexaboride tip. A 25 μm-thick pyrolytic graphite sheet was used as the graphite sheet, and a 25 μm-thick metal foil was also used as the rhenium metal foil.

None of the materials react with tantalum, niobium, and hexaboride even at high temperatures and when the materials have a thickness of 25 μm, the materials are sufficiently thin and flexible and thus, the materials do not disturb the joining method in manufacturing the electron source according to this example. By this method, by contacting the bottom of each of the plurality of recesses 117 of the metal tube 112 with a graphite sheet or rhenium foil on the outer periphery of the hexaboride tip 104, it is possible to obtain a robust and reliable electron source in which an intermetallic compound is not generated and the hexaboride chip does not fall off even when the electron source is heated for a long time.

The second is a method of filling a reaction barrier material such as glassy carbon, or glassy carbon and boron carbide between the metal tube 112 and the hexaboride tip 104. Specifically, the second method is a method in which furan resin or a mixture of furan resin and boron carbide powder is injected between the metal tube 112 and the hexaboride tip 104, and then the metal tube and the hexaboride tip are joined using the tool illustrated in Example 1, and further fired in vacuum to carbonize the furan resin to obtain a reaction barrier material 123 such as glassy carbon. FIG. 20 is a layout view of the metal tube 112, the hexaboride tip 104, and the reaction barrier material 123, and the left view is a perspective view illustrating the joining structure of the metal tube and the hexaboride tip, and the right view is a cross-sectional view at the joined part of the metal tube and the hexaboride tip. By this method, by contacting respective bottoms of the plurality of recesses 117 of the metal tube 112 with the reaction barrier material such as glassy carbon or glassy carbon and boron carbide on the outer periphery of the hexaboride tip 104, respectively, it is possible to obtain a robust and reliable electron source in which an intermetallic compound is not generated and the hexaboride chip does not fall off even when the electron source is heated for a long time.

When being used as the thermal electron source, sharpening of the hexaboride tip 104 is not necessarily required. When being used as a Schottky electron source, the tip is sharpened by electrolytic polishing as in Example 1. Subsequently, an electron source is introduced into a vacuum device to perform surface activation. When being used as the thermal electron source, the surface of the hexaboride tip is naturally cleaned by heating to the operating temperature. When being used as the Schottky electron source, first, surface cleaning is performed by an electric field evaporation method similarly as Example 1, and then heating is performed at high temperature to form an electron emission surface of the (013) plane. In the case of a Schottky electron source, if heating is continued as it is, Ce is always diffused and supplied from the crystal to the surface, and by applying an electric field E from the outside, it can be used as a Schottky electron source from which thermaly excited electrons are emitted over the Schottky barrier lowered by the external electric field E and mirror image potential. The configuration described in this example, that is, the configuration in which the reaction barrier sheet 122 or the reaction barrier material 123 is provided between the metal tube and the hexaboride tip can also be used in the field emission electron source.

As described above, according to this example, it is possible to provide an electron source which can be used stably for a long time even when a hexaboride is used. It is possible to provide a joining structure optimal for the hexaboride in the thermal electron source or the Schottky electron source and a method of manufacturing the joining structure. It is possible to provide a joining method capable of accurately setting the optical axis alignment of a minute tip of the hexaboride, and to improve the yield of manufacturing the electron source.

EXAMPLE 3

Example 3 will be described with reference to FIG. 21. The matters described in Example 1 or Example 2 but not described in Example 3 can be applied to Example 3, unless there are special circumstances. In Example 3, an example of a scanning electron microscope on which a field emission electron source 100 of CeB$_6$ manufactured in Example 1 is mounted is illustrated. In Example 3, although the scanning electron microscope using the field emission electron source is described as an example, but a method of the electron source and the electron beam device is not limited thereto.

FIG. 21 is a schematic overall cross-sectional view of a scanning electron microscope according to Example 3. Electrons emitted from the tip 104 of CeB$_6$ single crystal of the field emission electron source are accelerated by an anode 211 to become electron beams 230, are focused by a condenser lens 215, an objective lens 216, and an astigmatic correction coil 217, are scanned by a deflection scanning coil 218 and irradiated to an observation area on a sample 219, and generated secondary electrons are detected by a secondary electron detector 220. The reference numeral 221 indicates an element analyzer. In this case, since the electrons emitted from the CeB$_6$ single crystal tip 104 have a narrower energy width and better monochromaticity than the W field emission electron source, chromatic aberration in the condenser lens 215, the objective lens 216, and the like is reduced, a more focused electron beams 230 can be applied to the sample 219 and a high resolution scanning electron microscope image can be obtained. Since brightness is higher than that of the W field emission electron source, it is possible to shorten the imaging time and also shorten the analysis time for element analysis and the like. Thus, performance of the scanning electron microscope could be improved by mounting the field emission electron source described in Example 1.

As described above, according to this example, it is possible to provide a high-brightness, high-resolution electron beam device using an electron source that can be used stably for a long time even when using a hexaboride.

The present invention is not limited to the examples described above, and includes various modification examples.

For example, a length measurement SEM using the thermal field emission electron source or the Schottky electron source, a simple SEM using a thermal electron source, a transmission electron microscope using the field emission electron source or a thermal electron source, and the like may be included.

The present invention includes the following embodiments.

(1) An electron source including;

a filament made of a metal, a metal tube that is fixed to the filament and has a plurality of recesses disposed at least in two axial directions so as to surround a central axis at an outer periphery, a graphite sheet or rhenium foil disposed inside the metal tube, and a columnar hexaboride tip that emits an electron, is disposed so as to protrude from the inside of the metal tube to a side opposite to the filament, and is in contact with the graphite sheet or rhenium foil disposed at the bottom of each of the plurality of recesses of the metal tube.

(2) An electron source including;

a filament made of a metal, a metal tube that is fixed to the filament and has a plurality of recesses disposed at least in two axial directions so as to surround a central axis at an outer periphery, and a columnar hexaboride tip that emits an electron, is disposed so as to protrude from the inside of the metal tube to a side opposite to the filament, and is coated with glassy carbon or a mixture of glassy carbon and boride carbon and in contact with the plurality of recesses of the metal tube.

(3) An electron source assembling method including;

a first process of preparing a columnar hexaboride tip, a metal tube, a guide pin shorter in length than the metal tube, a filament made of metal, and a stem including an electrode pin, a second process of sequentially inserting the guide pin and the columnar hexaboride tip into the metal tube, a third process of pressure welding the metal tube with a blade of pressure-welding tool having projections in at least two axial directions so as to surround a central axis at an outer periphery of the metal tube, a fourth process of attaching the filament to the metal tube on a side where the columnar hexaboride tip does not protrude, and a fifth process of connecting the filament to the electrode pin of the stem.

(4) In the (3) described above, after the second process, a process of inserting a graphite sheet or rhenium foil between the columnar hexaboride tip and the metal tube is further included.

(5) In the (3) described above, after the second process, a process of injecting glassy carbon or a mixture of glassy carbon and boride carbon between the columnar hexaboride tip and the metal tube is further included.

The examples described above are described in detail to explain the present invention in an easy-to-understand manner, and are not necessarily limited to those having all the configurations described. Some of the configurations of an example may be replaced with configurations of other examples, and the configurations of the other example may be added to the configuration of the example. Other configurations may be added, deleted, or substituted for some of the configurations of each example.

REFERENCE SIGNS LIST

100: electron source
101: stem
102: electrode pin
103: filament
104: tip
105: hexaboride single crystal
106: metal sheet
107: electron beam welded-part
108: semi-seamless tube
109: die
110: metal pipe
111: cutter
112: metal tube
113: guide pin
114: pedestal
115: blade of pressure-welding tool
116: stereomicroscope
117: recess
118: electrolyte solution
119: counter electrode
120: power supply
121: colorimetric thermometer
122: reaction barrier sheet
123: reaction barrier material
124-1, 124-2: positioning jig
201: metal atom
202: boron atom
211: anode
215: condenser lens
216: objective lens
217: astigmatic correction coil
218: deflection scanning coil
219: sample
220: secondary electron detector
221: element analyzer
230: electron beam

The invention claimed is:

1. An electron source comprising:
a filament made of a metal;
a metal tube that is fixed to the filament and has a plurality of recesses disposed at least in two axial directions so as to surround a central axis at an outer periphery; and
a columnar hexaboride tip that emits an electron, is disposed so as to protrude from the inside of the metal tube to a side opposite to the filament, and is in contact with a bottom of each of the plurality of recesses of the metal tube.

2. The electron source according to claim 1, wherein the metal tube is joined to the filament by spot welding.

3. The electron source according to claim 1, wherein the metal tube has a plurality of other recesses at other positions of the metal tube in the axial direction, in addition to the plurality of recesses.

4. The electron source according to claim 1, wherein the hexaboride tip has a square pole shape, and the plurality of recesses are formed in two axes and four directions with respect to the hexaboride tip having the square pole shape.

5. The electron source according to claim 1, wherein the hexaboride tip has a circular cylindrical shape, and the plurality of recesses are formed in three axes and three directions with respect to the hexaboride tip having the circular cylindrical shape.

6. The electron source according to claim 1, wherein the metal tube is made of tantalum or niobium.

7. The electron source according to claim 1, wherein an inner diameter of the metal tube is in a range of 1.1 to 1.5 times the largest diameter of the hexaboride tip.

8. The electron source according to claim 1, wherein a thickness of the metal tube is in a range of 100 to 200 µm.

9. An electron beam device comprising:
an electron source;
a sample stand on which a sample is placed; and
an electron optical system for irradiating a sample on the sample stand with an electron emitted from the electron source, wherein
the electron source is the electron source according to claim 1.

10. An electron source comprising:
a filament made of a metal;
a metal tube that is fixed to the filament and has a plurality of recesses disposed at least in two axial directions so as to surround a central axis at an outer periphery;
a graphite sheet or rhenium foil disposed inside the metal tube; and
a columnar hexaboride tip that emits an electron, is disposed so as to protrude from the inside of the metal tube to a side opposite to the filament, and is in contact with the graphite sheet or rhenium foil disposed at the bottom of each of the plurality of recesses of the metal tube.

11. An electron beam device comprising:
an electron source;
a sample stand on which a sample is placed; and
an electron optical system for irradiating a sample on the sample stand with an electron emitted from the electron source, wherein
the electron source is the electron source according to claim 10.

12. An electron source comprising:
a filament made of a metal;
a metal tube that is fixed to the filament and has a plurality of recesses disposed at least in two axial directions so as to surround a central axis at an outer periphery; and
a columnar hexaboride tip that emits an electron, is disposed so as to protrude from the inside of the metal tube to a side opposite to the filament, and is coated with glassy carbon or a mixture of glassy carbon and boride carbon and is in contact with the plurality of recesses of the metal tube.

13. An electron beam device comprising:
an electron source;
a sample stand on which a sample is placed; and
an electron optical system for irradiating a sample on the sample stand with an electron emitted from the electron source, wherein
the electron source is the electron source according to claim 12.

* * * * *